(12) United States Patent
Liang

(10) Patent No.: US 11,004,681 B2
(45) Date of Patent: May 11, 2021

(54) DEFECT-FREE HETEROGENEOUS SUBSTRATES

(71) Applicant: HEWLETT PACKARD ENTERPRISE DEVELOPMENT LP, Houston, TX (US)

(72) Inventor: Di Liang, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/930,688

(22) Filed: May 13, 2020

(65) Prior Publication Data

US 2020/0273702 A1    Aug. 27, 2020

Related U.S. Application Data

(62) Division of application No. 15/756,577, filed as application No. PCT/US2015/048365 on Sep. 3, 2015, now Pat. No. 10,658,177.

(51) Int. Cl.
| | | |
|---|---|---|
| *H01L 21/02* | (2006.01) | |
| *H01L 21/764* | (2006.01) | |
| *H01L 29/06* | (2006.01) | |

(52) U.S. Cl.
CPC .. *H01L 21/02639* (2013.01); *H01L 21/02428* (2013.01); *H01L 21/02505* (2013.01); *H01L 21/764* (2013.01); *H01L 29/0657* (2013.01)

(58) Field of Classification Search
None
See application file for complete search history.

(56) References Cited

U.S. PATENT DOCUMENTS

| | | |
|---|---|---|
| 4,408,330 A | 10/1983 | An |
| 5,294,808 A | 3/1994 | Lo |
| 5,512,375 A | 4/1996 | Green et al. |
| 5,764,670 A | 6/1998 | Ouchi |
| 5,883,009 A | 3/1999 | Villa et al. |

(Continued)

FOREIGN PATENT DOCUMENTS

| | | |
|---|---|---|
| CN | 1476132 A | 2/2004 |
| CN | 101467083 A | 6/2009 |

(Continued)

OTHER PUBLICATIONS

Basak, J. et al., Developments in Gigascale Silicon Optical Modulators Using Free Carrier Dispersion Mechanisms, Apr. 15, 2008, Advances in Optical Technologies, vol. 2008, 10 pages.

(Continued)

*Primary Examiner* — Erik Kielin
(74) *Attorney, Agent, or Firm* — Sheppard Mullin Richter & Hampton LLP

(57) ABSTRACT

In example implementations of a heterogeneous substrate, the heterogeneous substrate includes a first material having an air trench, a second material coupled to the first material, a dielectric mask on a first portion of the second material and an active region that is grown on a remaining portion of the second material. An air gap may be formed in the air trench by the second material coupled to the first material. Defects in the second material may be contained to an area below the dielectric mask and the active region may remain defect free.

15 Claims, 5 Drawing Sheets

(56) References Cited

U.S. PATENT DOCUMENTS

| | | |
|---|---|---|
| 5,981,400 A | 11/1999 | Lo |
| 6,265,321 B1 | 7/2001 | Chooi et al. |
| 6,288,426 B1 | 9/2001 | Gauthier et al. |
| 6,437,372 B1 | 8/2002 | Geva et al. |
| 6,475,873 B1 | 11/2002 | Kalnitsky et al. |
| 6,492,283 B2 | 12/2002 | Raaijmakers et al. |
| 6,493,476 B2 | 12/2002 | Bendett |
| 6,515,333 B1 | 2/2003 | Riccobene |
| 6,526,083 B1 | 2/2003 | Kneissl et al. |
| 6,585,424 B2 | 7/2003 | Chason et al. |
| 6,705,681 B2 | 3/2004 | Russ |
| 6,706,581 B1 | 3/2004 | Hou et al. |
| 6,849,866 B2 | 2/2005 | Taylor |
| 6,902,987 B1 | 6/2005 | Tong et al. |
| 7,087,452 B2 | 8/2006 | Joshi et al. |
| 7,217,584 B2 | 5/2007 | Yue et al. |
| 7,231,123 B2 | 6/2007 | Sugita et al. |
| 7,368,816 B2 | 5/2008 | Lim et al. |
| 7,560,361 B2 | 7/2009 | Frank et al. |
| 7,579,263 B2 | 8/2009 | Han et al. |
| 7,639,719 B2 | 12/2009 | Fang et al. |
| 7,817,881 B2 | 10/2010 | Li |
| 7,838,314 B2 | 11/2010 | Choi et al. |
| 7,869,473 B2 | 1/2011 | Ye et al. |
| 7,935,559 B1 | 5/2011 | Giffard et al. |
| 7,949,210 B2 | 5/2011 | Durfee et al. |
| 8,078,018 B2 | 12/2011 | Mouli |
| 8,106,468 B2 | 1/2012 | Wang et al. |
| 8,344,453 B2 | 1/2013 | Muller |
| 8,372,673 B2 | 2/2013 | Lee et al. |
| 8,488,917 B2 | 7/2013 | Manipatruni et al. |
| 8,502,279 B2 | 8/2013 | Toh et al. |
| 8,538,206 B1 | 9/2013 | Fish et al. |
| 8,664,087 B2 | 3/2014 | Chang et al. |
| 8,716,852 B2 | 5/2014 | Shu et al. |
| 8,937,981 B2 | 1/2015 | Liang |
| 9,018,675 B2 | 4/2015 | Bedell et al. |
| 9,059,252 B1 | 6/2015 | Liu et al. |
| 9,093,428 B2 | 7/2015 | Liang |
| 9,110,314 B2 | 8/2015 | Tu et al. |
| 9,240,406 B2 | 1/2016 | Feng et al. |
| 9,269,724 B2 | 2/2016 | Han et al. |
| 9,509,122 B1 | 11/2016 | Norberg et al. |
| 9,570,351 B2 | 2/2017 | Liang |
| 9,640,531 B1 | 5/2017 | Or-Bach et al. |
| 9,773,906 B2 | 9/2017 | Wang et al. |
| 2002/0081793 A1 | 6/2002 | Yang et al. |
| 2002/0094661 A1 | 7/2002 | Enquist et al. |
| 2002/0113288 A1 | 8/2002 | Clevenger et al. |
| 2002/0121337 A1 | 9/2002 | Whatmore et al. |
| 2002/0168837 A1 | 11/2002 | Hsu et al. |
| 2003/0006407 A1 | 1/2003 | Taylor |
| 2003/0025976 A1 | 2/2003 | Wipiejewski |
| 2003/0058902 A1 | 3/2003 | Yuen |
| 2003/0081642 A1 | 5/2003 | Hwang et al. |
| 2003/0134446 A1 | 7/2003 | Koike et al. |
| 2003/0169786 A1 | 9/2003 | Kapon et al. |
| 2003/0203550 A1 | 10/2003 | Lai et al. |
| 2004/0028092 A1 | 2/2004 | Kim |
| 2004/0081386 A1 | 4/2004 | Morse et al. |
| 2004/0152272 A1 | 8/2004 | Fladre et al. |
| 2004/0184502 A1 | 9/2004 | Miyachi et al. |
| 2004/0206299 A1* | 10/2004 | Tadatomo ............... C30B 29/40 117/84 |
| 2004/0248334 A1 | 12/2004 | Hoss et al. |
| 2004/0257171 A1 | 12/2004 | Park et al. |
| 2004/0264530 A1 | 12/2004 | Ryou et al. |
| 2005/0081958 A1 | 4/2005 | Adachi et al. |
| 2005/0106790 A1 | 5/2005 | Cheng et al. |
| 2005/0139857 A1 | 6/2005 | Shin |
| 2005/0207704 A1 | 9/2005 | Keyser et al. |
| 2006/0035450 A1 | 2/2006 | Frank et al. |
| 2006/0063679 A1 | 3/2006 | Yue et al. |
| 2006/0181542 A1 | 8/2006 | Granger |
| 2007/0275505 A1 | 11/2007 | Wolterink et al. |
| 2008/0012145 A1 | 1/2008 | Jang |
| 2008/0018983 A1 | 1/2008 | Ishii et al. |
| 2008/0175294 A1 | 7/2008 | Kim et al. |
| 2008/0265377 A1 | 10/2008 | Clevenger et al. |
| 2008/0283877 A1 | 11/2008 | Collonge et al. |
| 2009/0080488 A1 | 3/2009 | Hatakeyama et al. |
| 2009/0101997 A1 | 4/2009 | Lammel et al. |
| 2009/0110342 A1 | 4/2009 | Webster et al. |
| 2009/0168821 A1 | 7/2009 | Fang et al. |
| 2009/0194152 A1 | 8/2009 | Liu et al. |
| 2009/0200636 A1 | 8/2009 | Edelstein et al. |
| 2009/0238515 A1 | 9/2009 | Fattal et al. |
| 2009/0242935 A1 | 10/2009 | Fitzgerald |
| 2009/0263076 A1 | 10/2009 | Mathai et al. |
| 2009/0302415 A1 | 12/2009 | Mueller et al. |
| 2010/0060970 A1 | 3/2010 | Chen |
| 2010/0098372 A1 | 4/2010 | Manipatruni et al. |
| 2010/0119231 A1 | 5/2010 | Kim et al. |
| 2010/0140629 A1 | 6/2010 | Lee et al. |
| 2010/0140739 A1 | 6/2010 | Kim |
| 2010/0215309 A1 | 8/2010 | Shubin et al. |
| 2010/0295083 A1 | 11/2010 | Celler |
| 2011/0026879 A1 | 2/2011 | Popovic et al. |
| 2011/0045644 A1 | 2/2011 | Barth et al. |
| 2011/0064099 A1 | 3/2011 | Govorkov et al. |
| 2011/0073989 A1 | 3/2011 | Rong et al. |
| 2011/0176762 A1 | 7/2011 | Fujikata et al. |
| 2011/0180795 A1 | 7/2011 | Lo et al. |
| 2011/0188112 A1 | 8/2011 | Stievater et al. |
| 2011/0211786 A1 | 9/2011 | Ushida et al. |
| 2011/0293216 A1 | 12/2011 | Lipson et al. |
| 2012/0002285 A1 | 1/2012 | Matsuda |
| 2012/0008658 A1 | 1/2012 | Chung |
| 2012/0091463 A1 | 4/2012 | Yokogawa et al. |
| 2012/0119258 A1 | 5/2012 | Liang |
| 2012/0189239 A1 | 7/2012 | Tu et al. |
| 2012/0257850 A1 | 10/2012 | Fujikata et al. |
| 2013/0009182 A1 | 1/2013 | Jung et al. |
| 2013/0009321 A1 | 1/2013 | Kagawa et al. |
| 2013/0029449 A1 | 1/2013 | Cheng et al. |
| 2013/0049203 A1 | 2/2013 | Ahrens et al. |
| 2013/0063226 A1 | 3/2013 | Burak et al. |
| 2013/0137202 A1 | 5/2013 | Assefa et al. |
| 2013/0147021 A1 | 6/2013 | Puurunen et al. |
| 2013/0152694 A1 | 6/2013 | Urvas et al. |
| 2013/0155484 A1 | 6/2013 | Sweatlock et al. |
| 2013/0168776 A1 | 7/2013 | Liang et al. |
| 2014/0141546 A1 | 5/2014 | Cho |
| 2014/0177994 A1 | 6/2014 | Chen |
| 2014/0264723 A1 | 9/2014 | Liang et al. |
| 2014/0307997 A1 | 10/2014 | Bar et al. |
| 2015/0055910 A1 | 2/2015 | Liang |
| 2015/0069418 A1 | 3/2015 | Heo et al. |
| 2015/0140720 A1 | 5/2015 | Collins |
| 2015/0144928 A1 | 5/2015 | Forrest et al. |
| 2015/0177458 A1 | 6/2015 | Bowers et al. |
| 2015/0179447 A1 | 6/2015 | Ryou |
| 2015/0212266 A1 | 7/2015 | Czornomaz et al. |
| 2016/0094014 A1 | 3/2016 | Shin et al. |
| 2016/0126381 A1 | 5/2016 | Wang et al. |
| 2016/0202504 A1 | 7/2016 | Kim et al. |
| 2016/0238860 A1 | 8/2016 | Liang et al. |
| 2017/0077325 A1 | 3/2017 | Norberg et al. |
| 2017/0139132 A1 | 5/2017 | Patel et al. |
| 2017/0146740 A1 | 5/2017 | Orcutt et al. |
| 2017/0358607 A1 | 12/2017 | Balakrishnan et al. |

FOREIGN PATENT DOCUMENTS

| | | |
|---|---|---|
| CN | 100514099 C | 7/2009 |
| CN | 102314057 B | 5/2014 |
| EP | 2146243 A1 | 1/2010 |
| JP | 2005-093742 A | 4/2005 |
| JP | 2010-278396 A | 12/2010 |
| WO | 2013/066318 A1 | 5/2013 |
| WO | 2013/165376 A1 | 11/2013 |
| WO | 2014/021781 A1 | 2/2014 |
| WO | 2014/209398 A1 | 12/2014 |

(56) References Cited

FOREIGN PATENT DOCUMENTS

| WO | 2016/018285 A1 | 2/2016 |
|---|---|---|
| WO | 2016/122547 A1 | 8/2016 |
| WO | 2017/123245 A1 | 7/2017 |

OTHER PUBLICATIONS

Caglar Duman et al. "Comparative modeling results for ridge waveguide MOW and hybrid Si/III-V lasers" Journal of radiation research and applied sciences, Nov. 17, 2017, pp. 1-5.
Chen et al., "Active Transmission Control Based on Photonic-Crystal MOS Capacitor," Photonic Crystal Materials and Devices VI, Proc. of SPIE, vol. 6480, Jan. 23, 2007, pp. 1-9.
D. Dai et al., High speed modulation of hybrid silicon evanescent lasers, IPNRA, Jul. 12 2009. paper IMC1.
Delphine Marris-Morini et al., "D006—State of the art on Photonics on CMOS," Nov. 30, 2009, pp. 1-70, Available at: <helios-project. eu/content/download/326/2147/file/HELIOS.sub.—D006.pd-f>.
European Search Report and Search Opinion Received for EP Application No. 11871524.2, dated Jul. 16, 2015, 8 pages.
European Search Report and Search Opinion Received for EP Application No. 11875113.0, dated Jul. 30, 2015, 3 pages.
Extended European Search Report received for EP Application No. 12875835.6, dated Feb. 18, 2016, 14 pages.
Fan et al., "Impact of Interfacial Layer and Transition Region on Gate Current Performance for High-K Gate Dielectric Stack: Its Tradeoff With Gate Capacitance", IEEE Transactions on Electron Devices, vol. 50(2), Feb. 2003, pp. 433-439.
Fang et al., "Electrically pumped hybrid AlGaInAs-silicon evanescent laser", Optics Express, Optical Society of America, vol. 14(20), Oct. 2, 2016, pp.pp. 9203-9210.
G. Morthier et al., "Microdisk Lasers Heterogeneously Integrated on Silicon for Low-Power, High-Speed Optical Switching," Photonics Society Newsletter, Jun. 2010, vol. 24, Issue 3, pp. 5-10, IEEE, Available at: <lecture.ecc.u-tokyo.ac.jp/.about.tlecwada/ Optics%20&%20Photonics/pres-entation%20files/paper9.pdf>.
Google search (hybrid laser, waveguide, substrate) pp. 1-2.
Gosh, S., et al; "Experimental and Theoretical Investigation of Thermal Stress Relief During Epitaxial Growth of Ge on Si Using Air-gapped Sio2 Nanotemplates"; Oct. 2011; 9 pages.
Gosh, S., et al; "Investigations on Thermal Stress Relief Mechanism Using Air-gapped Sio2 Nanotemplates During Epitaxial Growth of Ge on Si and Corresponding Hole Mobility Improvement"; Apr. 2012, 4 pages.
Haataja, M. et al.; "Dislocations and Morphological Instabilities: Continuum Modeling of Misfitting Heteroepitaxial Films"; Apr. 5, 2002; 20 pages.
Heck et ,al., "Hybrid Silicon Photonics for Optical Interconnects," IEEE Journal of Selected Topics in Quantum Electronics, Aug. 13, 2010, pp. 1-14.
Hirakawa K. et al., High Resolution Subpixel and Subframe Rendering for Color Flatpanel and Projector Displays, 2011 18th IEEE International Conference, Sep. 11-14, 2011, pp. 1725-1728.
International Search Report and Written Opinion received for PCT Application No. PCT/US2016/013605, dated Oct. 13, 2016, 10 pages.
International Search Report and Written Opinion received for PCT Patent Application No. PCT/US16/24823, dated Dec. 26, 2016, 10 pages.
International Search Report and Written Opinion received for PCT Patent Application No. PCT/US19/29478, dated Aug. 27, 2019, 13 pages.
International Search Report and Written Opinion received for PCT Patent Application No. PCT/US2011/050083, dated May 1, 2012, 7 pages.
International Search Report and Written Opinion received for PCT Patent Application No. PCT/US2011/058756, dated Aug. 27, 2012, 6 pages.
International Search Report and Written Opinion received for PCT Patent Application No. PCT/US2012/035893, dated Dec. 26, 2012, 8 pages.
International Search Report and Written Opinion received for PCT Patent Application No. PCT/US2014/048818, dated Apr. 22, 2015, 11 pages.
International Search Report and Written Opinion received for PCT Patent Application No. PCT/US2014/048833, dated Apr. 29, 2015, 9 pages.
International Search Report and Written Opinion received for PCT Patent Application No. PCT/US2015/048365, dated May 30, 2016, 11 pages.
Jeong, Y-K et al.; "High Quality High-k MIM Capacitor by Ta2O5/ HfO2/Ta2O5 Multi-layered Dielectric and NH3 Plasma Interface Treatments for Mixed-Signal/RF Applications,"; Jun. 15-17, 2004: pp. 222-223.
Jung et al., "Hybrid integration of 111-V semiconductor lasers on silicon waveguides using optofluidic microbubble manipulation", Scientific Reports, Jul. 19, 2016, pp. 1-7.
Kissinger et al., "Void-free silicon-wafer-bond strengthening in the 200-400 C range", Sens. Actuators. A 36, 1993, pp. 149-156.
Kuldeep Amarnath, "Active Microring and Microdisk Optical Resonators on Indium Phosphide," Dissertation, 2006, pp. 1-163, Available at: <drum.lib.umd.edu/bitstream/1903/3513/1/umi-umd-3343. pdf>.
Li et al., "Wafer Scale Fiexible Interconnect Fabrication for Heierogeneous Integration", TU Delft, Oct. 26, 2015, 94 pages.
Liang et al, "Highly efficient vertical outgassing channels for low-temperature InP-to-silicon direct wafer bonding on the silicon-on-insulator substrate", American Vacuum Society, 2008, pp. 1560-1568.
Liang et al., "III-V-on-Silicon Hybrid Integration, Materials, Devices, and Applications," IEEE, 2010, pp. 151-152.
Liang et al., "Optimization of Hybrid Silicon Microring Lasers", IIEEE Photonics Journal, vol. 3(3), Jun. 28, 2011, pp. 580-587.
Liu et al, "A High-Speed Silicon Optical Modulator Based on a Metal-Oxide-Semiconductor Capacitor," Nature Publishing Group,vol. 427, Feb. 12, 2004, pp. 615-618.
Liu et al., "High-speed optical modulation based on carrier depletion in a silicon waveguide", Optics Express 660, vol. 15(2), Jan. 22, 2007, 9 pages.
Luo et al. "High-throughput multiple dies-to-wafer bonding technology and III/V-on-Si hybrid laser for heterogeneous integration of optoelectronic integrated circuits", Research Gate,vol. 2, Article 28, Apr. 2015, 22 pages.
Partial Supplementary European Search Report received for EP Application No. 12875835.6, dated Oct. 11, 2015, 6 pages.
Sysak et al., "Hybrid Silicon Laser Technology: A Thermal Perspective," IEEE Journal of Selected Topics in Quantum Electronics, vol. 17(6), 2011, pp. 1490-1498.
Tang et al., "50 Gb/s hybrid silicon traveling-wave electroabsorption modulator", Optics Express,vol. 9(7), Mar. 18, 2011, pp. 5811-5816.
Xia et al., "Tetracene air-gap single-crystal field-effect transistors", Applied Physics Letters 90, 2007, pp. 162106-1-162106-3.
Yanagisawa et al. "Film-Level hybrid integration of AlGaAs laser diode with glass waveguide on Si substrate" IEEE Photonics Technology Letters, vol. 4(1), Jan. 1992, pp. 21-23.
Thou et al., "On-chip light sources for silicon photonics", CIOMP, Aug. 2015, 13 pages.

* cited by examiner

DEFECT-FREE HETEROGENEOUS SUBSTRATES

CROSS-REFERENCE TO RELATED APPLICATIONS

This application claims priority to U.S. patent application Ser. No. 15/756,577, which was filed on 28 Feb. 2018 and is now U.S. patent Ser. No. 10/658,177, which is based on Application No. PCT/US2015/048365 filed on 3 Sep. 2015, both of which are herein incorporated by reference in their entireties for all purposes.

BACKGROUND

The growth of materials on a substrate offers an opportunity to create metastable structures with unique physical and chemical properties. Generally, the material and the substrate are the same material or based on the same material and have a similar lattice structure and properties.

Heteroepitaxy is a technique used to integrate different materials together for increased functionalities or enhanced device performance. Methods and techniques for combining different materials and substrates have evolved over recent years.

DETAILED DESCRIPTION

The present disclosure discloses a defect free heterogeneous substrate and method for creating the same. As discussed above, heteroepitaxy is a technique used to integrate different materials together for increased functionalities or enhanced device performance. However, defects can form in the epitaxial layer if the lattice constant and thermal expansion coefficient of the two materials do not match.

Example implementations of the present disclosure provide a defect free heterogeneous substrate by applying a dielectric mask on the second material. The dielectric material may be applied around an area of the second material that is directly over the air trench or air gap. The dielectric mask may help contain defects away from the active region and the active region may be grown defect free.

Figure 1:
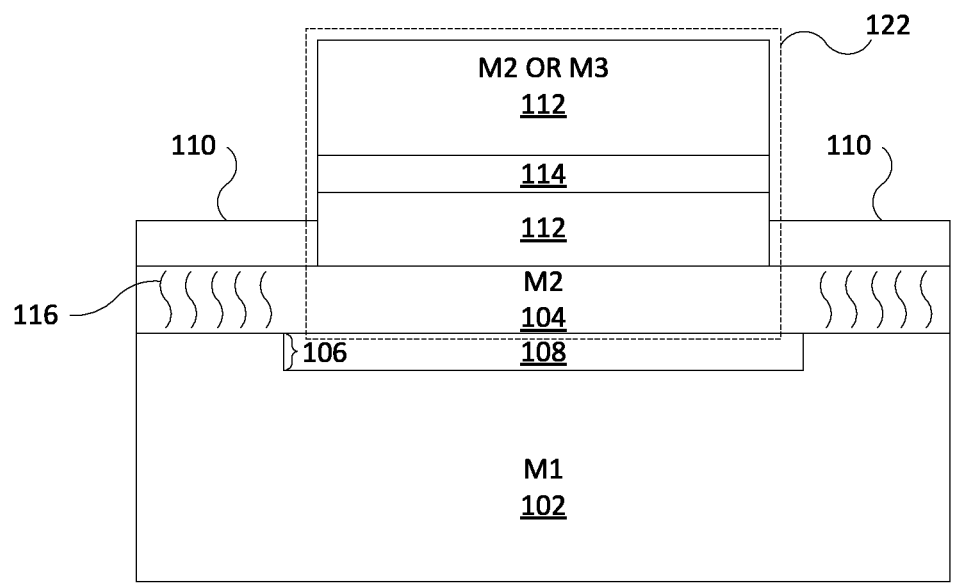
FIG. 1 is a block diagram of an example heterogeneous substrate of the present disclosure.

FIG. 1 illustrates an example heterogeneous substrate 100 of the present disclosure. In one example, the heterogeneous substrate 100 may include a first layer (e.g., M1) 102 of a first material, a second layer (e.g., M2) 104 of a second material, a dielectric mask 110 and a defect free region 122. In some implementations, the first layer 102 may be a metal, semiconductor, dielectric or a plastic. For example, the first material of the first layer 102 may be silicon (Si), gallium arsenide (GaAs), indium phosphide (InP), silica glass ($SiO_2$), and the like. In some implementations, the second material of the second layer 104 may be a semiconductor, metal or dielectric. For example, the second layer may be GaAs, InP, gallium nitride (GaN), copper (Cu), and the like.

In one example, the defect free region 122 may include an active region 114. In one example, the active region 114 may be grown as part of a third layer 112. The third layer (e.g., M3) 112 may comprises a third material that is the same as or similar to the second material. For example, if the second layer 104 is GaAs, the third layer 112 may also be GaAs or aluminum gallium arsenide (AlGaAs).

In one example, the first layer 102 may include an air trench 106. A depth of the air trench 106 may be relatively shallow (e.g. 100 nanometers (nm) or less). The depth of the air trench 106 may vary depending on the particular application or materials that are used. In one example, the air trench 106 may be located approximately in a center of the first layer 102.

In one example, the second layer 104 may be bonded to the first layer 102. However, the first material of the first layer 102 and the second material of the second layer 104 may have different lattice structures and thermal expansion coefficients. As a result, when the second layer 104 is bonded to the first layer 102, defects 116 may appear in the second layer 104 of the second material.

In some instances, the air gap 108 that is formed in the air trench 106 may help prevent some defects 116 from appearing in the defect free region 122. However, even with a shallow air trench formed in the first material, defects can grow upwards at angles less than 90 degrees. In other words, defects can grow at an angle, or laterally, into the active region. The thicker the second material, the longer the defects can propagate laterally. In addition, as the thickness of the second layer 104 increases, the defects 116 can continue to grow, including laterally into the defect free region 122.

One example of the present disclosure applies the dielectric mask 110 to prevent the defects 116 from growing laterally into the defect free region 122. The dielectric mask helps to ensure that the defects 116 remain in an area below the dielectric mask 110 and prevents the defects 116 from spreading into the defect free region 122.

In one example, the dielectric mask 110 may be grown around the air gap 108. Said another way, the dielectric mask 110 may be applied to the second layer 104 in all areas except an area that is over the air trench 106. To illustrate, if the first layer 102 has an area of 100 square microns ($\mu m^2$) and the air trench 106 is covered by a 25 $\mu m^2$ area of the second layer 104, the dielectric mask 110 may be applied to all of the second layer 104 except the 25 $\mu m^2$ area that is above the 25 $\mu m^2$ air trench 106. It should be noted that the numerical values are only provided as examples and that the actual dimensions may vary.

In another example, if the air gap 108 is formed in the air trench 106 having a square shape, then the dielectric mask 110 would be grown on a first portion of the second layer 104 around the perimeter of the square shape of the air trench 106 and the air gap 108. In some implementations, the dielectric mask 110 may be grown on an area that is smaller than the area outside the perimeter of the air trench 106 and the air gap 108. A smaller area of the dielectric mask 110 may be better at helping to ensure that the defects 116 are blocked from the defect free region 122.

The active region 114 and the third layer 112 may be grown on a remaining portion of the second layer 104 that does not have the dielectric mask 110. For example, the remaining portion may be an area on the second layer 104 that is directly above or within an area of the air gap 108.

In some implementations, the dielectric mask 110 may be an amorphous non-crystal structure. Some examples of amorphous non-crystal structures may include silicon dioxide ($SiO_2$), silicon nitride ($Si_3N_4$), and the like.

Figure 2:
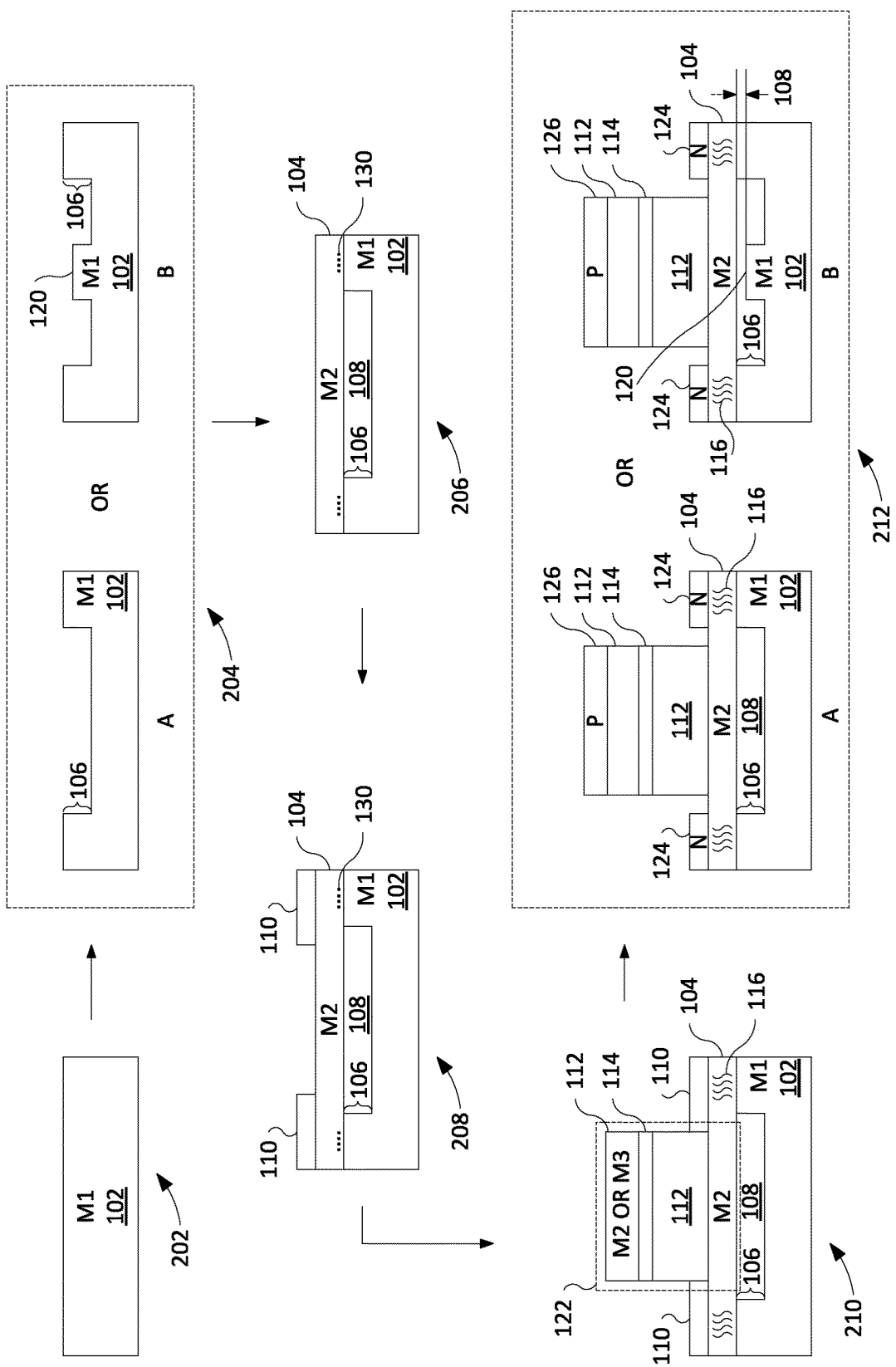
FIG. 2 is an example schematic process flow diagram of the present disclosure.

In one example, the heterogeneous substrate 100 may be an intermediate substrate of an overall process of fabricating a device (e.g., a laser or a waveguide). For example, FIG. 2 illustrates an example schematic process flow diagram 200 of the present disclosure that includes the heterogeneous substrate 100.

At block 202, the first layer 102 may be provided. At block 204, the air trench 106 may be etched into the first layer 102. In one example, the air trench 106 may be etched as shown by version A. In another example, the air trench 106 may include a waveguide 120 as shown in version B. The air trench 106 may be etched by using a pattern, lithography, and etch process. The remaining blocks illustrate the use of version A, but it should be noted that all remaining blocks would be similarly executed for version B of the first layer 102.

At block 206, the second layer 104 is applied to the first layer 102. The air gap 108 is formed in the air trench 106 by the second layer 104 and the first layer 102.

As discussed above, the second layer 104 may have a different lattice constant and a different thermal expansion coefficient than the first layer 102. As a result, dislocations 130 may begin to appear at the contact interface of the first layer 102 and the second layer 104 and continue propagating in the second layer 104.

At block 208, the dielectric mask 110 may be applied to the second layer 104. In one example, the dielectric mask 110 may be applied around the air gap 108 and the air trench 106 where the active region will be grown. The dielectric mask 110 may be applied using various different techniques such as, for example, sputtering, deposition, thermal oxidation, spinning, and the like. The dielectric mask 110 may be removed from the area over the air gap 108 and the air trench 106 by using a patterning, lithography and etching process.

At block 210, the active region 114 in the third layer 112 may be grown on the remaining portions of the second layer 104 that are not covered by the dielectric mask 110. The dielectric mask 110 may prevent the defects 116 that grow during the growth of the third layer 112 and the active region 114 from entering the defect free region 122. The defect free region 122 may include portions of the second layer 104, the third layer 112 and the active region 114 within the third layer 112. Block 210 illustrates the heterogeneous substrate 100 that is illustrated in FIG. 1.

At block 212, the dielectric mask 110 may be removed and metal contacts 124 and 126 may be applied to heterogeneous substrate 100. The dielectric mask may be removed by a masking and etching process. The metal contacts 124 and 126 may be applied via a sputtering or other deposition processes. For example, n-type contacts 124 may be applied to an area where the dielectric mask 110 was removed from and p-type contacts 126 may be applied to a top of the active region 114 or the third layer 112.

Figure 3:
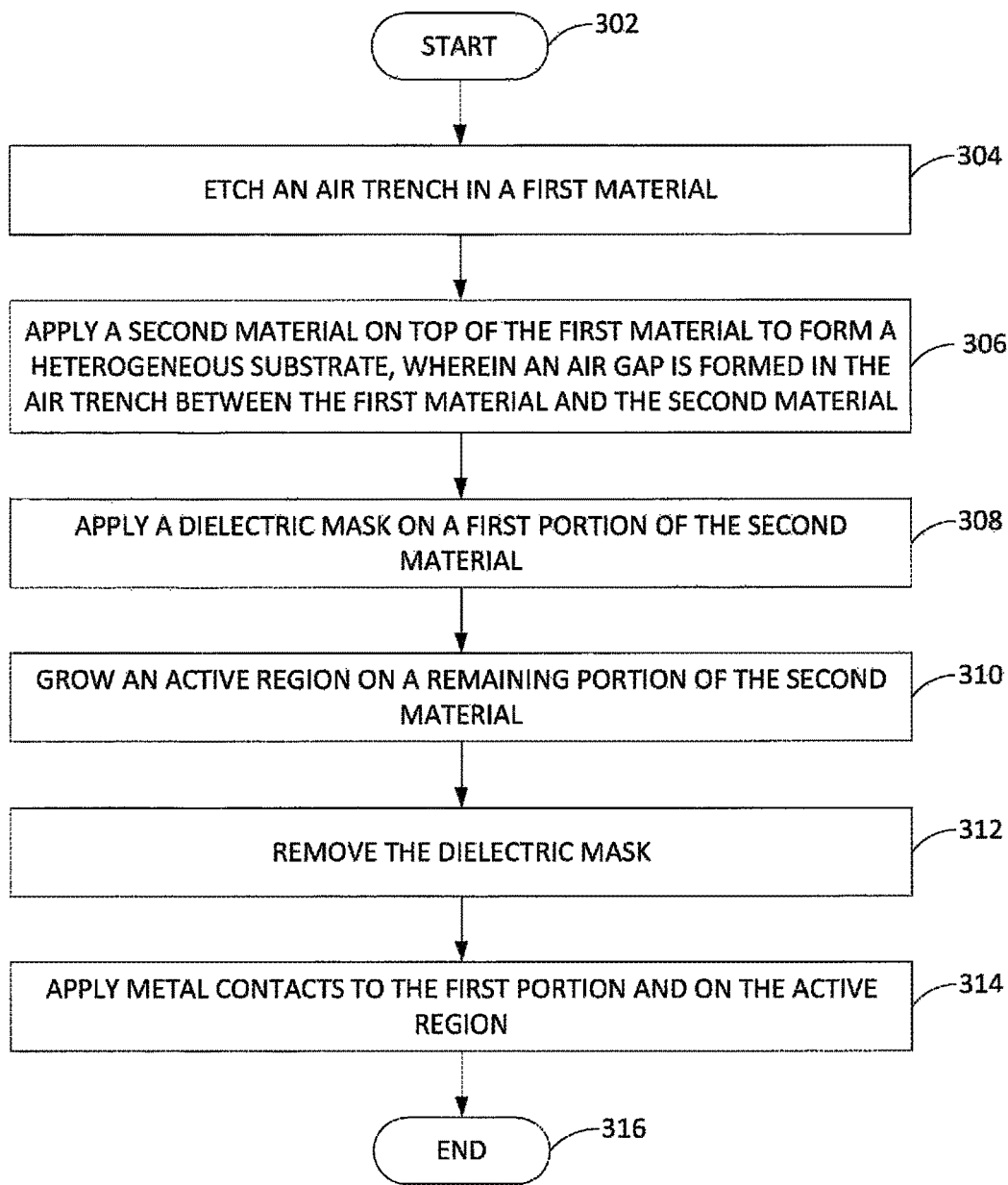
FIG. 3 is a flowchart of an example method for fabricating the heterogeneous substrate.

Block 212 illustrates the version A and the version B with the metal contacts 124 and 126. As discussed above, version B may include a waveguide 120. As a result, the air gap 108 for version B may be a distance between a top of the waveguide 120 and a bottom of the second layer 104 as illustrated by the lines extended to the right, FIG. 3 illustrates an example flowchart of another method 300 for fabricating the heterogeneous substrate 100. In one example, the method 300 may be performed in a wafer fabrication plant using a plurality of different automated tools (e.g., CVD tools, wet etch tools, dry etch tools, ion implantation tools, sputtering tools, wet oxidation tools, and the like) to perform the different processes described.

At block 302 the method 300 begins. At block 304, the method 300 etches an air trench in a first material. In one example, the first material may be a metal, semiconductor or a dielectric. For example, the first material may be silicon (Si), gallium arsenide (GaAs), indium phosphide (InP), silica glass ($SiO_2$), and the like.

The depth of the air trench may be relatively shallow. The depth of the air trench may vary depending on the particular application or materials that are used. In some implementations, the air trench may be 100 nm or less. The air trench may be formed in the first material in approximately the center of the first material. The air trench may have a generally square or rectangular shape in the first material.

At block 306, the method 300 applies a second material on top of the first material to form a heterogeneous substrate, wherein an air gap is formed in the air trench between the first material and the second material. In one example, the second material may be a semiconductor. For example, the second material may be GaAs, InP, gallium nitride (GaN), and the like.

In one example, the top of the first material may be defined as the side of the first material that has the air trench etched in block 304. The second material may be applied or bonded to the first material over the air trench to form an air gap in the air trench between the first material and the second material.

At block 308, the method 300 applies a dielectric mask on a first portion of the second material. In one example, the first portion of the second material may be an area of the second material around the air gap and the air trench. In other words, any part of the second material that is directly above the air gap or the air trench would not be part of the first portion.

In one example, the dielectric mask may be an amorphous non-crystal structure. Some examples of amorphous non-crystal structures may include silicon dioxide ($SiO_2$), silicon nitride ($Si_3N_4$), and the like.

At block 310, the method 300 grows an active region on a remaining portion of the second material. In one example, the remaining portion may include any portion of the second material that does not have the dielectric mask. Said another way, the remaining portion may be the area of the second material that is over the air trench and air gap and covers an area approximately equal to or smaller than the air trench.

In one example, the active region may be grown as part of a third material that is grown on the remaining portion of the second material. The third material may be the same as or similar to the second material. For example, if the second material is GaAs, the third material may also be GaAs or AlGaAs.

In one example, the active region and part of the second material that the active region is grown on top of may be considered a defect free region. In other words, the dielectric mask contains the defects in the second layer to an area directly below the dielectric mask. The dielectric mask helps to prevent the defects from growing laterally into the defect free region.

At block 312, the method 300 removes the dielectric mask. For example, a mask may be applied to the top of the active region and the dielectric mask may be etched away. The mask on top of the active region may then also be etched away to prepare the heterogeneous substrate for application of metal contacts.

At block 314, the method 300 applies metal contacts to the first portion and on the active region. For example, n-type metal contacts may be applied to locations where the dielectric mask was removed and a p-type metal contact may be applied to the top of the active region. At block 316, the method 300 ends.

Figure 4:
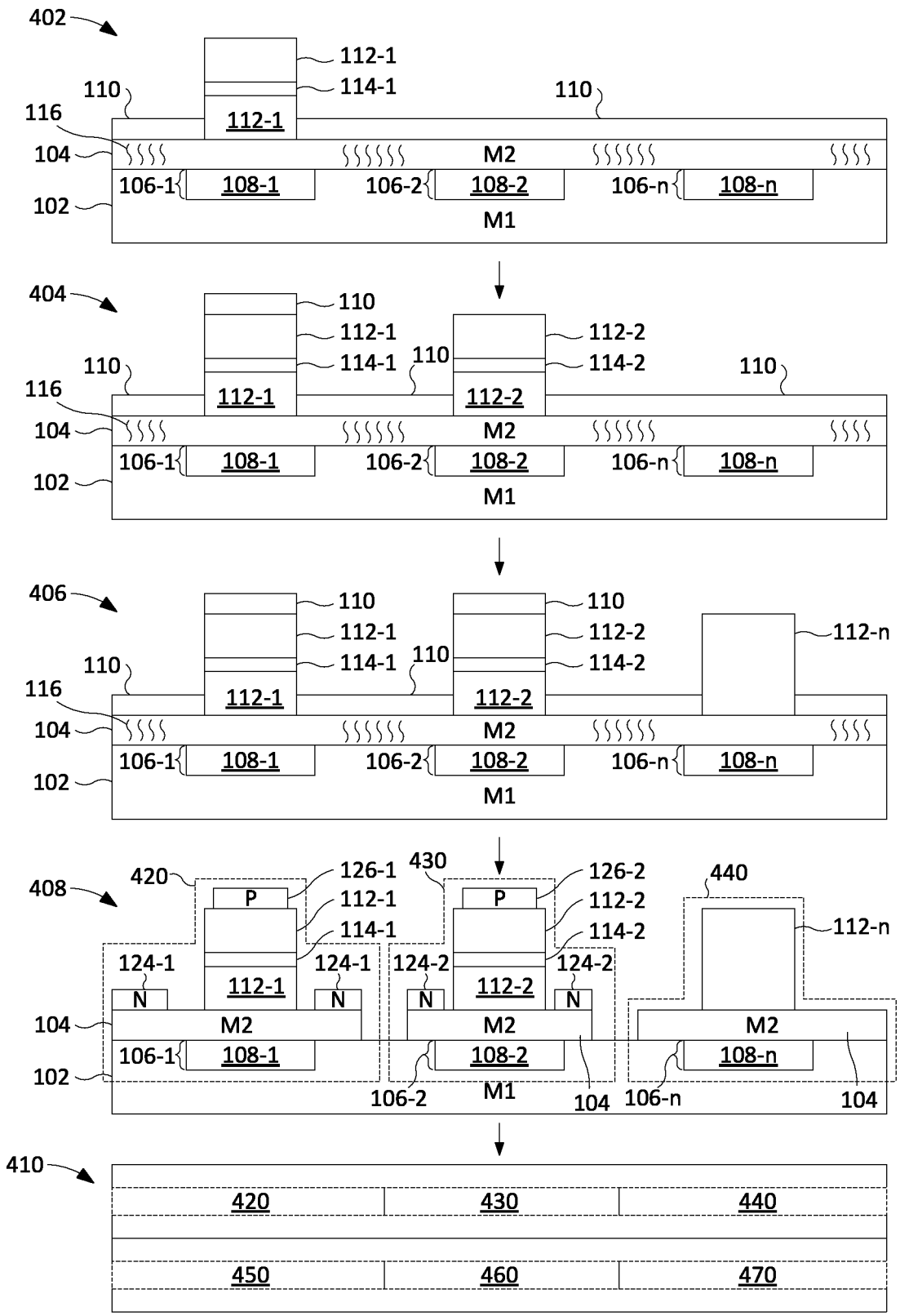
FIG. 4 is another example schematic process flow of the present disclosure.

FIG. 4 illustrates another example schematic process flow 400 of the present disclosure. For example, the present disclosure may be used to build a plurality of different types of devices on the same substrate. For example, the dielectric mask may be used to enable bandgap engineering and dense integration on the same substrate. This provides lower costs and more efficient fabrication of multiple devices.

In FIG. 4, blocks 402-408 illustrate a cross-sectional view of the process flow 400 and block 410 illustrates a top down view of the completed devices formed from the heterogeneous substrate. At block 402, a first active region 114-1 may be grown as part of a third layer 112-1 on top of a portion of the second layer 104 that does not have the dielectric mask 110 applied. The first active region 114-1 may be grown over the portion of the second layer 104 that is over the first air gap 108-1 in the first air trench 106-1 of the first layer 102 having a plurality of air gaps 108-$n$ and a plurality of air trenches 106-$n$.

In one example, each one of the air trenches 106-1 to 106-$n$ may be etched similar to block 204 of FIG. 2, described above. The second layer 104 may be applied to the first layer 102 over the air trenches 106-1 to 106-$n$ to form the air gaps 108-1 to 108-$n$ as described above at block 206 of FIG. 2. The dielectric mask 110 may be applied as described above in block 208 of FIG. 2. An active region 114-1 and a third layer 112-1 may be grown as described above at block 210 of FIG. 2.

However, in FIG. 4, the dielectric mask 110 is applied to cover the areas of the second layer 104 other than an area over the first air trench 106-1 and the first air gap 108-1. In other words, the other areas of the second layer 104 over the remaining air trenches 106-2 to 106-$n$ and air gaps 108-2 to 108-$n$ are covered by the dielectric mask 110.

At block 404, the dielectric mask 110 is applied to the third layer 112-1. A portion of the dielectric mask 110 that had covered the area on the second layer 104 that is above the second air trench 106-2 and the second air gap 108-2 is removed. With the portion of the dielectric mask 110 removed, an active region 114-2 in a third layer 112-2 is grown on top of the second layer 104 that is over the second air trench 106-2 and the second air gap 108-2. In one example, the third layer 112-1 and the third layer 112-2 may be different materials to form different devices.

At block 406, process steps similar to block 404 may be repeated until the nth third layer 112-$n$ is grown on the second layer 104 that is over the nth air trench 106-$n$ and nth air gap 108-$n$. For example, the dielectric mask 110 that had covered the area on the second layer 104 that is above the nth air trench 106-$n$ and nth air gap 108-$n$ is removed. With the portion of the dielectric mask 110 removed, an nth third layer 112-$n$ is grown on top of the second layer 104 that is over the nth air trench 106-$n$ and nth air gap 108-$n$. In one example, the nth third layer 112 may be a passive waveguide with no active region 114.

At block 408, the dielectric mask 110 may be removed from the heterogeneous substrate and metal layers may be applied. For example, a portion of the second layer 104 between each device 420, 430 and 440 may be etched away to isolate each device 420, 430 and 440 from one another. In some implementations, device 420 may be a laser, the device 430 may be a modulator/photodetector, and the device 440 may be a passive waveguide.

N-type metal layers 124-1 and 124-2 may be applied to the second layer 104 where the dielectric mask 110 was previously located. P-type metal layers 126-1 and 126-2 may be applied to the top of the third layer 112-1 and the third layer 112-2. The device 440 may not use metal contacts, for example, when the device 440 is a passive waveguide.

Block 410 illustrates a top view of the completed devices. For example, multiple rows of devices 420, 430, 440, 450, 460 and 470 may be fabricated. It should be noted that although only three devices per row are illustrated in FIG. 4, that each row may contain any number of devices. It should be noted that although only two rows are illustrated in FIG. 4, that any number of rows may be included in the heterogeneous substrate for device fabrication.

Figure 5:
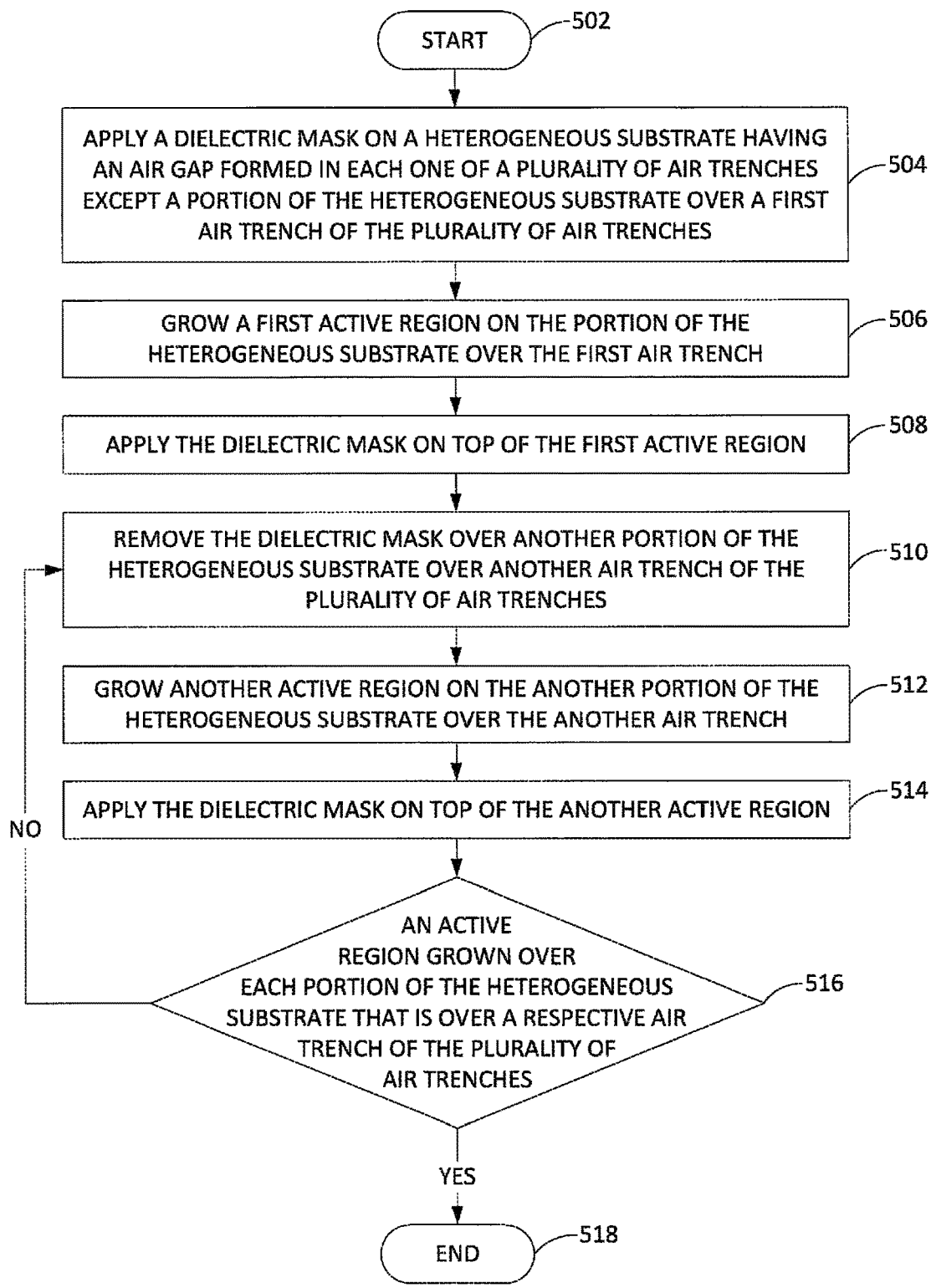
FIG. 5 is a flowchart of an example method for fabricating another example heterogeneous substrate of the present disclosure.

FIG. 5 illustrates an example flowchart of another method 500 for fabricating the heterogeneous substrate 100. In one example, the method 500 may be performed in a wafer fabrication plant using a plurality of different automated tools (e.g., CVD tools, wet etch tools, dry etch tools, ion implantation tools, sputtering tools, wet oxidation tools, and the like) to perform the different process described.

At block 502 the method 500 begins. At block 504, the method 500 applies a dielectric mask on a heterogeneous substrate having an air gap formed in each one of a plurality of air trenches except a portion of the heterogeneous substrate over a first air trench of the plurality of air trenches. For example, a single first layer of a first material may be used to etch the plurality of air trenches. A second layer of a second material may be applied to the first layer of the first material to form the heterogeneous substrate. An air gap may be formed in each one of the plurality of air trenches between the first layer of the first material and the second layer of the second material.

The dielectric mask may then be applied to the second layer of the second material except for an area of the second layer that is over a first air gap in a first air trench. The area that is not covered by the dielectric mask may be approximately equal to the area of the first air trench (e.g., may have similar dimensions or a similar length and width of the first air trench).

At block 506, the method 500 grows a first active region on the portion of the heterogeneous substrate over the first air trench. In one example, the first active region may be part of a third layer that is grown on the second layer. The third layer may be a same material or a similar material as the second material of the second layer.

At block 508, the method 500 applies the dielectric mask on top of the first active region. The dielectric mask may be applied on top of the first active region to prevent dislocations or defects from growing in the first active region, while subsequent active regions or third layers are grown on the second layer.

At block 510, the method 500 removes the dielectric mask over another portion of the heterogeneous substrate over another air trench of the plurality of air trenches. For example, the another portion may be an area on the second layer that is over a second air trench or a second air gap. The another portion may have an area that is approximately the same as the area of the corresponding air trench. In one example, the second air trench may be an air trench that is adjacent to the first air trench.

At block 512, the method 500 grows another active region on the another portion of the heterogeneous substrate over the another air trench. For example, similar to block 506, a second active region is grown on a second portion of the second layer that is over the second air trench.

At block 514, the method 500 applies the dielectric mask on top of the another active region. For example, similar to block 508, the dielectric mask may be applied on top of the most recently grown active region to prevent dislocations or defects from growing in the most recently grown active region.

At block 516, the method 500 determines if an active region is grown over each portion of the heterogeneous substrate that is over a respective air trench of the plurality of air trenches. If the answer is no, the method 500 repeats the removing in block 510, the growing in block 512 and the applying in block 514 until the answer to block 516 is yes. In other words, the removing in block 510, the growing in block 512 and the applying in lock 514 may be repeated until an active region is grown over each portion of the heterogeneous substrate that is over a respective air trench of the plurality of air trenches. For example, if the heterogeneous substrate has 10 air trenches in the first layer, the method 500 would repeat blocks 510, 512 and 514 nine times after the initial active region is grown (e.g., for a total of 10 devices) over a first portion of the second layer that is over a first air trench.

If the answer to block 516 is yes, the method 500 proceeds to block 518. In other words, an active region has been grown on each area of the second layer that is over an air trench or air gap. At block 518, the method 500 ends.

It will be appreciated that variants of the above-disclosed and other features and functions, or alternatives thereof, may be combined into many other different systems or applications. Various presently unforeseen or unanticipated alternatives, modifications, or variations, therein may be subsequently made which are also intended to be encompassed by the following claims.

The invention claimed is:
1. A heterogeneous substrate, comprising:
a first material having an air trench;
a second material coupled to the first material to form an air gap in the air trench;
a dielectric mask on a first portion of the second material; and
a semiconductor region grown on a remaining portion of the second material and not on the dielectric mask such that the semiconductor region is disposed within a perimeter of the air trench, wherein defects in the second material are contained to an area below the dielectric mask, and the semiconductor region is defect free.

2. The heterogeneous substrate of claim 1, wherein a lattice constant or a thermal expansion coefficient of the first material is different than a lattice constant or a thermal expansion coefficient of the second material.

3. The heterogeneous substrate of claim 1, wherein the first material comprises a dielectric substrate having a waveguide in the air trench.

4. The heterogeneous substrate of claim 1, wherein the second material comprises a semiconductor.

5. The heterogeneous substrate of claim 1, wherein the air trench is formed in a center of the first material.

6. The heterogeneous substrate of claim 1, wherein the dielectric mask comprises an amorphous non-crystal structure.

7. The heterogeneous substrate of claim 1, wherein the dielectric mask comprises at least one of: a silicon oxide or a silicon nitride.

8. The heterogeneous substrate of claim 1, wherein the remaining portion comprises an area of the second material that is directly over the air gap.

9. A method, comprising:
etching an air trench in a first material;
applying a second material on top of the first material to form a heterogeneous substrate, wherein an air gap is formed in the air trench between the first material and the second material;
applying a dielectric mask on a first portion of the second material;
growing a semiconductor region on a remaining portion of the second material and not on the dielectric mask such that the semiconductor region is disposed within a perimeter of the air trench;
removing the dielectric mask; and
applying metal contacts to the first portion and on the semiconductor region.

10. The method of claim 9, wherein a lattice constant or a thermal expansion coefficient of the first material is different than a lattice constant or a thermal expansion coefficient of the second material.

11. The method of claim 9, wherein the dielectric mask comprises at least one of: a silicon oxide or a silicon nitride.

12. The method of claim 9, wherein the dielectric mask comprises an amorphous non-crystal structure.

13. The method of claim 9, wherein the first material comprises a dielectric substrate having a waveguide in the air trench.

14. The method of claim 9, wherein the second material comprises a semiconductor.

15. The method of claim 9, wherein the air trench is formed in a center of the first material.

* * * * *